(12) United States Patent
Mayer

(10) Patent No.: US 10,131,268 B2
(45) Date of Patent: Nov. 20, 2018

(54) LASER UNIT FOR A VEHICLE HEADLIGHT

(71) Applicant: ZIZALA LICHTSYSTEME GMBH, Wieselburg (AT)

(72) Inventor: Matthias Mayer, Mank (AT)

(73) Assignee: ZKW Group GmbH, Wieselburg an der Erlauf (AT)

(*) Notice: Subject to any disclaimer, the term of this patent is extended or adjusted under 35 U.S.C. 154(b) by 178 days.

(21) Appl. No.: 15/112,289

(22) PCT Filed: Jan. 20, 2015

(86) PCT No.: PCT/AT2015/050016
§ 371 (c)(1),
(2) Date: Jul. 18, 2016

(87) PCT Pub. No.: WO2015/106303
PCT Pub. Date: Jul. 23, 2015

(65) Prior Publication Data
US 2016/0332558 A1    Nov. 17, 2016

(30) Foreign Application Priority Data

Jan. 20, 2014  (AT) .............................. A 50032/2014

(51) Int. Cl.
*F21V 17/02* (2006.01)
*B60Q 1/068* (2006.01)
(Continued)

(52) U.S. Cl.
CPC ............ B60Q 1/0683 (2013.01); F21S 41/14 (2018.01); F21S 41/16 (2018.01); F21S 41/36 (2018.01);
(Continued)

(58) Field of Classification Search
CPC ........ B60Q 1/0683; F21S 41/16; F21S 41/36; F21S 41/14; F21S 41/365; F21S 45/47;
(Continued)

(56) References Cited

U.S. PATENT DOCUMENTS 3,657,792 A * 4/1972 Hug ......................... H04N 3/08
                                                         29/407.04
9,766,427 B1 * 9/2017 Barney .................. G02B 7/182
(Continued)

FOREIGN PATENT DOCUMENTS

EP          1359450 A1    11/2003
EP          2447600 A2     5/2012
(Continued)

OTHER PUBLICATIONS

First Office Action for Austrian Patent Application No. A 50032/2014 dated Nov. 21, 2014.
(Continued)

*Primary Examiner* — Y M. Lee
(74) *Attorney, Agent, or Firm* — Eversheds Sutherland (US) LLP

(57) ABSTRACT

A laser unit (2) for a vehicle headlight with a laser diode (11) and, associated with the laser diode (11), adjustable optics with optical elements comprising at least one collimator, wherein at least one optical element selected from the group consisting of a collimator (13, 22) and a deflection mirror (20) is mounted so that it can pivot about at least one spatial axis.

17 Claims, 6 Drawing Sheets

Figure 1:
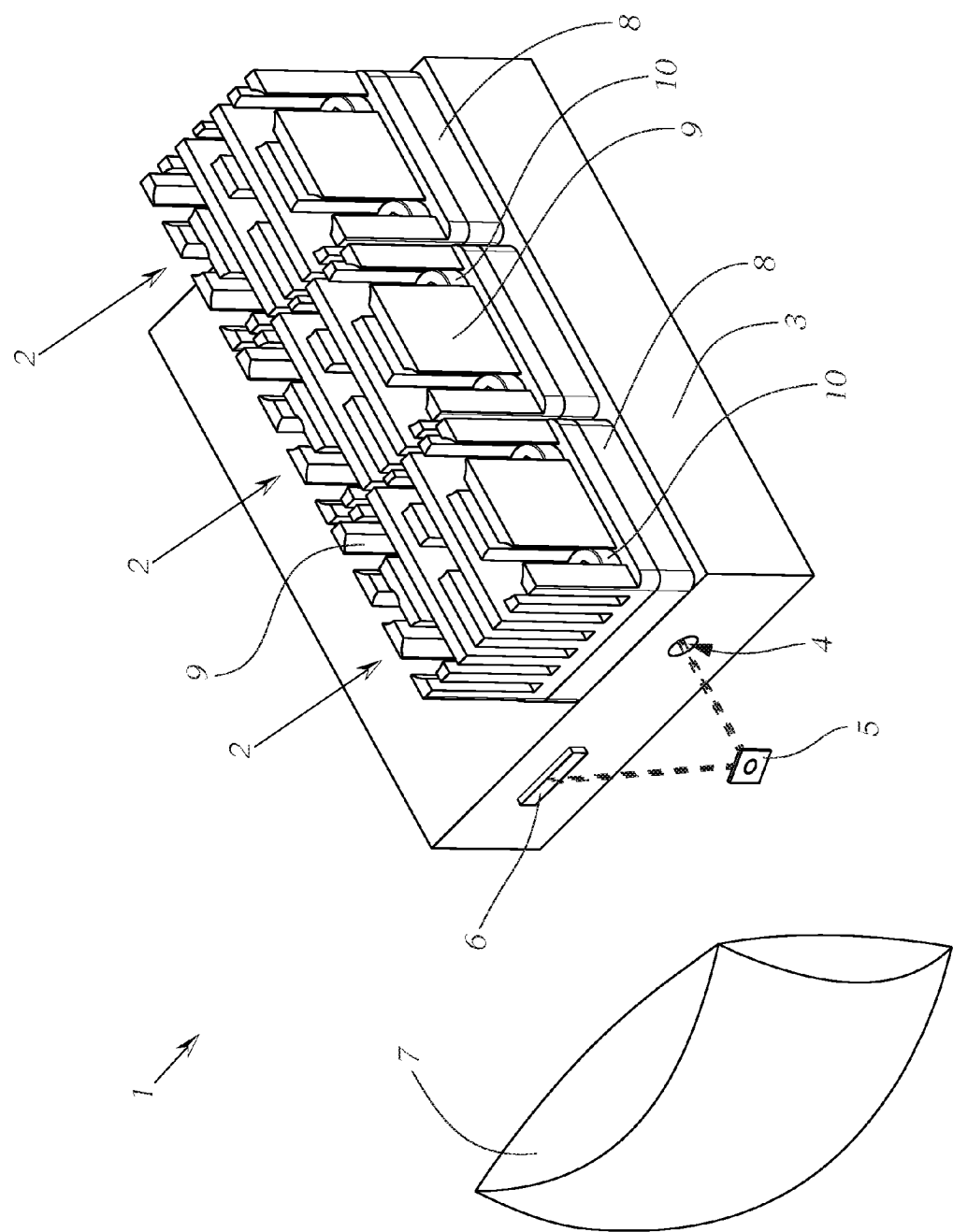

(51) Int. Cl.
| | |
|---|---|
| *H01S 5/00* | (2006.01) |
| *H01S 5/40* | (2006.01) |
| *G02B 7/00* | (2006.01) |
| *G02B 7/02* | (2006.01) |
| *F21S 41/14* | (2018.01) |
| *F21S 41/36* | (2018.01) |
| *F21S 41/16* | (2018.01) |
| *H01S 5/02* | (2006.01) |
| *H01S 5/022* | (2006.01) |
| *H01S 5/024* | (2006.01) |
| *F21S 45/49* | (2018.01) |
| *F21S 45/47* | (2018.01) |
| *F21S 41/365* | (2018.01) |

(52) U.S. Cl.
CPC ............ *G02B 7/004* (2013.01); *G02B 7/023* (2013.01); *H01S 5/005* (2013.01); *H01S 5/0071* (2013.01); *H01S 5/4012* (2013.01); *F21S 41/365* (2018.01); *F21S 45/47* (2018.01); *F21S 45/49* (2018.01); *H01S 5/02* (2013.01); *H01S 5/02212* (2013.01); *H01S 5/02469* (2013.01)

(58) Field of Classification Search
CPC ......... F21S 45/49; G02B 7/004; G02B 7/023; H01S 5/005; H01S 5/4012; H01S 5/0071; H01S 5/02469; H01S 5/02212; H01S 5/02
See application file for complete search history.

(56) References Cited

U.S. PATENT DOCUMENTS

| | | | |
|---|---|---|---|
| 2006/0139918 A1 | 6/2006 | Dolgin et al. | |
| 2007/0097501 A1 | 5/2007 | Stern et al. | |
| 2007/0097835 A1* | 5/2007 | Ophey | G11B 7/08576 369/112.21 |
| 2009/0046474 A1 | 2/2009 | Sato et al. | |
| 2009/0207626 A1 | 8/2009 | Kim | |
| 2010/0086441 A1* | 4/2010 | Lee | G01N 21/07 250/492.1 |
| 2011/0194302 A1 | 8/2011 | Kishimoto et al. | |
| 2012/0327678 A1 | 12/2012 | Koike et al. | |
| 2014/0085741 A1* | 3/2014 | Lambert | G02B 27/0983 359/859 |
| 2015/0137680 A1* | 5/2015 | Komatsu | B60Q 1/0023 315/82 |

FOREIGN PATENT DOCUMENTS

| | | |
|---|---|---|
| EP | 2525140 A2 | 11/2012 |
| JP | 2012109201 A | 6/2012 |
| WO | 2013146749 A1 | 10/2013 |

OTHER PUBLICATIONS

International Search Report for PCT/AT2015/050016 dated May 21, 2015.

* cited by examiner

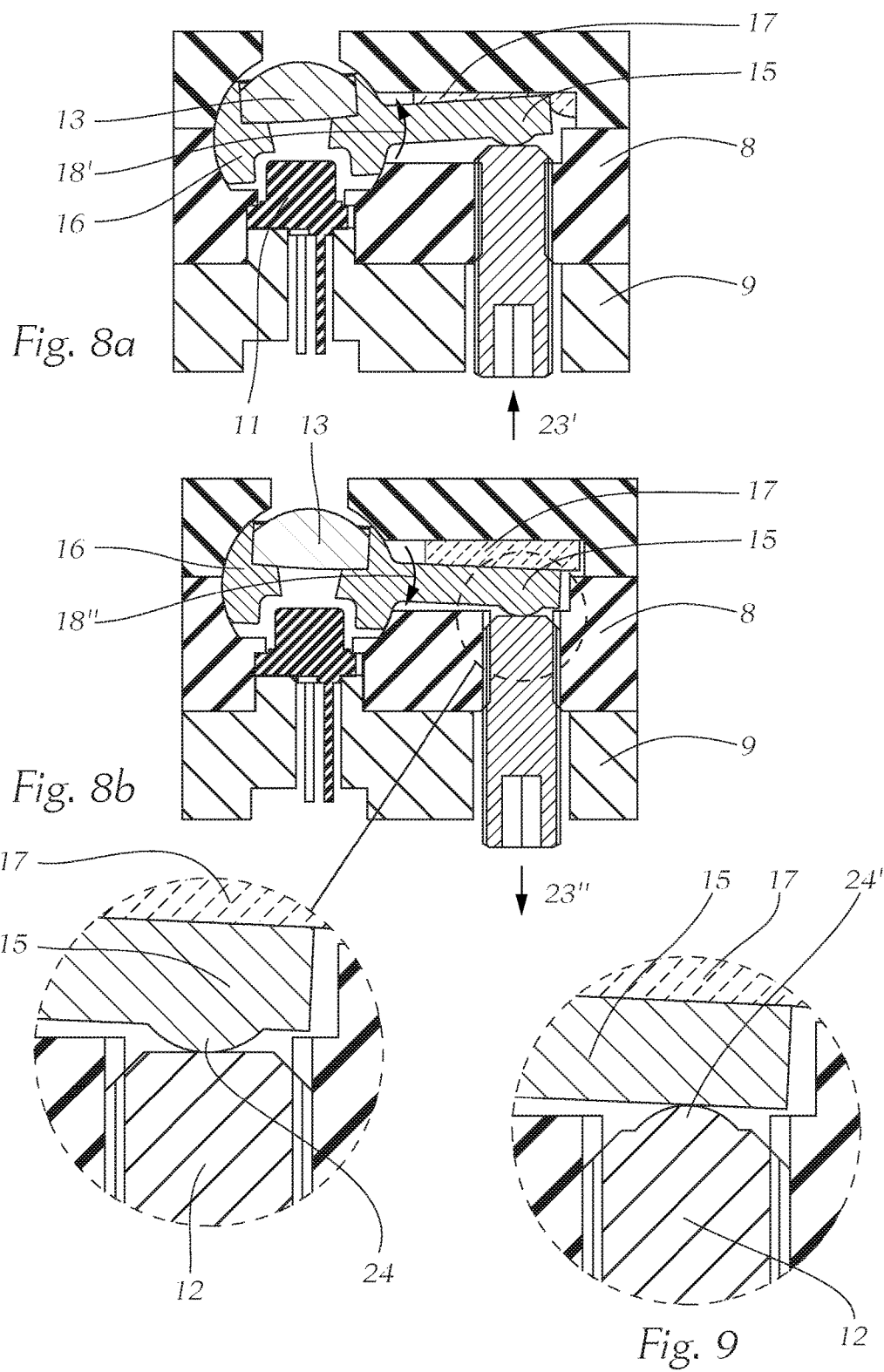

LASER UNIT FOR A VEHICLE HEADLIGHT

The invention relates to a laser unit for a vehicle headlight and a corresponding laser module.

The prior art discloses various types of vehicle headlights, in which the predominant light sources used in recent years have been discharge lamps and halogen light sources. To save energy and reduce the space required by vehicle headlights even more, the use of laser light sources such as semiconductor lasers is increasingly being tested, since they are advantageous in this respect. To make the laser light usable for a vehicle headlight, a laser light source is used to irradiate a means of light conversion, a so-called phosphor converter, which is excited by the laser light to emit visible light.

In so-called static systems, the laser beam is immovably directed onto the phosphor converter. By contrast, in so-called dynamic systems the laser beam(s) that are used to excite the phosphor converter are moved over the phosphor converter using oscillating mirrors, producing, for the eye, a light pattern that corresponds to the outer shape of the phosphor converter. Suitable shaping of the phosphor converter can achieve certain light functions or precise light/dark boundaries of the light functions, such as, for example, high beams, low beams, and functions of that kind.

For example, US 2011/0194302 A1 shows a laser unit in which a laser diode irradiates a fluorescent substance from behind through an optical waveguide element, the fluorescent substance then in turn emitting visible light that is directed, through a reflector screen, in the direction of travel. The laser light sources used emit energies up to 3 W in the headlight's main emission direction. Thus, malfunction or damage of the headlight can cause injuries due to the high-intensity eye-injuring laser light radiation, but at any rate endanger other road users.

Therefore, for a perfect and safe function of such a laser system in a vehicle headlight it is essential that the laser beam(s) be precisely directed onto the means of light conversion or the mirror(s) and subsequently onto the phosphor converter, this being done by adjustable optics that guide the light emitted from the laser diode onto a deflection mirror. For example if the diameter of an oscillating mirror is only a few millimeters, it is therefore of greatest importance that the laser be exactly directed onto the mirror, above all if multiple laser beams are used to excite means of light conversion. The adjustable optics must, as a rule, be individually adjusted for each laser, since the production tolerances of the laser and the optical elements of the adjustable optics and their fixing to a corresponding mounting element makes it impossible to preadjust them exactly enough to meet the requirements regarding their orientation.

The prior art has already proposed solutions for this, which involve cementing a collimator lens of a laser unit in a corresponding support plate using a lens holder, however this process requires great effort in mass production, in particular a certain manual dexterity in assembly. Moreover, it is difficult, when using multiple laser units to excite a phosphor converter, to achieve optimal coordination of the individual laser beams with one another once the adhesive used has cured, since readjustment is not easily possible.

Therefore, the invention has the goal of specifying a laser unit in which the adjustable optics associated with a laser diode, or their optical elements, can be adjusted in a simple and precise manner, and final fixation of the position of the lens can be done in a downstream mounting or process step only once the adjustment has been made.

This is accomplished by the laser unit of the type mentioned at the beginning having a laser diode and, associated with the laser diode, adjustable optics with optical elements comprising at least one collimator, and being characterized according to the invention in that at least one of the optical elements selected from the group consisting of a collimator and a deflection mirror is mounted so that it can pivot about at least one spatial axis. The laser unit with the laser diode and the adjustable optics can be fixed in or on a headlight, the pivotable fixation of the inventive optical elements allowing exact adjustment of the laser unit's laser beam after the laser unit is mounted, so that the laser beam strikes the phosphor converter exactly as previously calculated, and thus makes it fluoresce in a suitable manner. The fact that at least one of the inventive optical elements is mounted so that it can pivot about at least one spatial axis allows easy adjustment of the adjustable optics after the essential parts of the vehicle headlight have been assembled, making the manual dexterity that is necessary to adjust the lens relatively small. In connection with this invention, a collimator is defined not only as an optical element for parallel alignment of light beams, but rather the term "collimator" should also comprise focusing optical elements, in particular converging lenses.

It is preferable for the collimator to be in the form of an optical collimator lens mounted in a retaining element that is mounted so that it can pivot about at least one spatial axis. In this preferred case, the adjustable optics are adjusted by moving a collimator lens associated with the laser diode, subsequently allowing the laser beam to strike the phosphor converter directly or through one or more interposed optical elements and possibly an oscillating mirror. In the context of this invention, a collimator lens can also be understood to be a system made of multiple lenses, the multiple lenses in a collimator being used to correct optical or chromatic aberrations.

According to another preferred embodiment, the collimator is in the form of a parabolic mirror mounted in a retaining element that is mounted so that it can pivot about at least one spatial axis. In this preferred case, the adjustable optics are adjusted by moving a parabolic mirror associated with the laser diode, the parabolic mirror functioning as a collimator, subsequently allowing the laser beam to strike the phosphor converter directly or through one or more interposed optical elements and possibly an oscillating mirror.

One of the above-mentioned optical elements that might possibly be interposed can be, as already defined, a deflection mirror of the adjustable optics, it being possible, according to a preferred embodiment of this invention, for the deflection mirror to be fixed to a retaining element that is mounted so that can pivot about at least one spatial axis.

According to an especially preferred embodiment of this invention, the collimator is directed onto the deflection mirror and the retaining element for the collimator is mounted so that it can pivot about at least one spatial axis.

To ensure especially flexible adjustment of the optics, the invention is advantageously further developed in such a way that the retaining element is mounted so that it can pivot about two spatial axes. In this preferred embodiment, the light emitted by the laser diode can be directed both according to its height and also to the side, so that all inaccuracies can be compensated.

This invention provides that the collimator lens can pivot about the respective spatial axis in the range of ±3° from a neutral position, which should be sufficient to compensate for manufacturing tolerances of the individual elements of a laser unit.

To make it simple to adjust the lens holder, and thus the lens, the invention is preferably further developed in such a way that the retaining element has a receptacle part for the collimator or for the deflection mirror and one lever acting on the receptacle part to pivot the retaining element about each spatial axis. The direction in which the lever projects, and the center of rotation of the pivotable fixation of the retaining element define a pivot axis running perpendicular to the lever. Operating the lever makes the retaining element, and thus the collimator or the deflection mirror, move about the spatial axis defined in this way.

Preferably the invention is further developed in such a way that the retaining element has two levers acting on the receptacle part to pivot the retaining element about two spatial axes at right angles to one another, operating the lever allowing simple and rapid adjustment of the laser beam in the height direction and in the side direction.

Irrespective of whether only one lever or two levers now act on the receptacle part for the lens, the laser unit can, according to a preferred embodiment, be further developed in such a way that the receptacle part and the lever(s) are made together in a single piece. In the simplest case, the mentioned elements are made in the form of injection-molded parts.

An especially favorable embodiment of this invention is when one elastically deformable spring element is arranged between each lever and mounting element for the retaining element and each lever(s) can be pressed against the mounting element by an adjustment screw. Arranging a deformable spring element between a lever and the mounting element causes the lever to assume a defined position against the respective adjustment screw and allows it to be pressed against the deformable, especially elastic, bearing surface or spring element by turning the adjustment screw. Selecting the appropriate thickness of the spring element can ensure the required pivotability of the collimator or the retaining element about the respective spatial axis, the spring action of the spring element ensuring return of the lever at any time, if this should be necessary for a later readjustment.

According to a preferred embodiment of this invention, the lever(s) and the respective adjustment screw(s) interact through a spherically shaped part. Such a spherical shape provides a good transfer of force independent of the degree of the pivoting of the receptacle part, and it can be provided on the adjustment screw or on the lever with the same effect.

An especially favorable configuration of the inventive laser unit is achieved when the adjustment screw(s) is/are held, in such a way that it/they can rotate, in a support plate fixed on the mounting element, corresponding to a preferred embodiment of this invention. In addition to the mounting the adjustment screws, providing such a support plate also allows the pivotable fixation of the retaining element with the levers, if it is inserted into a corresponding recess in the mounting element and then covered using the support plate. After the support plate is fixed, for example by screws or cementing, all movable parts of the inventive laser unit are assembled and can be mounted on the headlight.

To ensure permanent fixation of the adjusted position of the retaining element or the inventive optical elements, the invention is preferably further developed in such a way that the adjustment screw(s) can be non-rotatably fixed, allowing permanent fixation even without final cementing of the lens holder. The invention is preferably further developed in such a way that each of the adjustment screw(s) is/are non-rotatably fixed by means of a jam nut.

In addition, it is naturally further conceivable that the retaining element is fixed by cementing, corresponding to a preferred embodiment of this invention.

The laser diodes are high-power components that produce large amounts of heat during operation as vehicle headlights. For this reason, the laser diodes used must normally be associated with cooling devices, to distribute and dissipate the large quantities of heat that occur at certain points. Therefore the invention is preferably further developed in such a way that the support plate has a heat sink fastened to it that has recesses for the adjustment screw(s), allowing the heat sink to make contact over a large area with the components that have a tendency to heat up, however, not affecting the adjustability of the lens holder or the collimator lens using the adjustment screws.

Although the invention has been described with reference to a laser unit consisting of one laser diode [and], associated with the laser diode, adjustable optics with optical elements, the person skilled in the art will be familiar with the fact that such laser units are, as a rule, combined into a laser module comprising multiple such laser units.

According to a preferred embodiment of this invention, such a laser module comprises three inventive laser units, the mounting units of the laser units being combined into a common beam path in which deflection mirrors are fixed.

Figure 2:
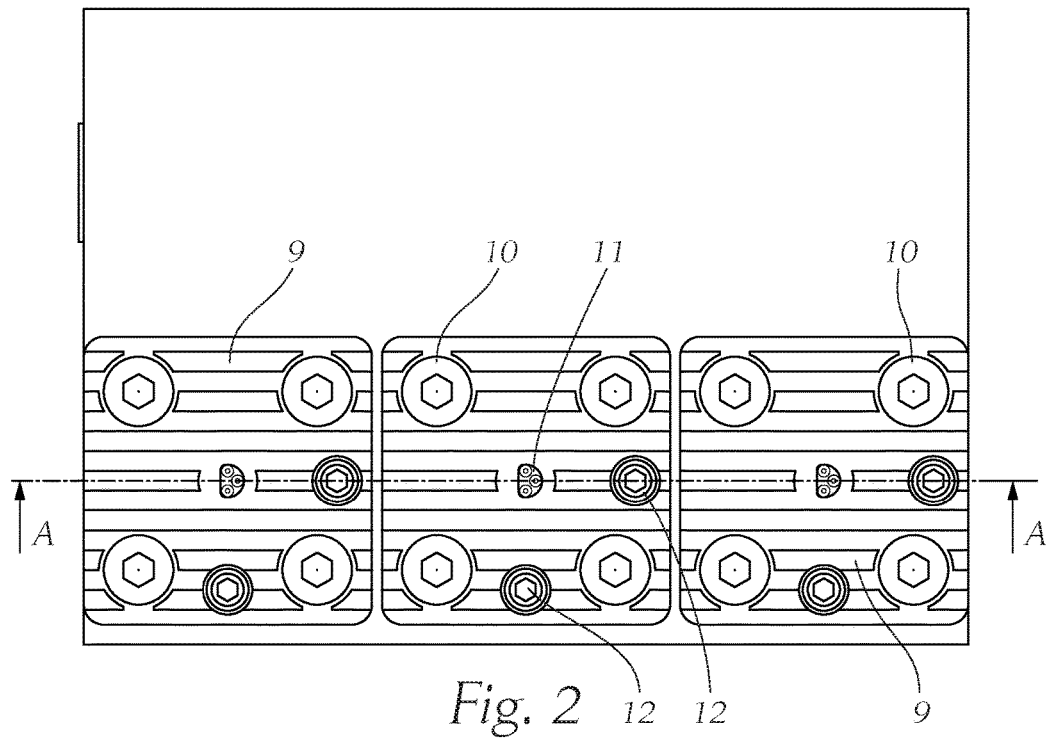
Figure 3:
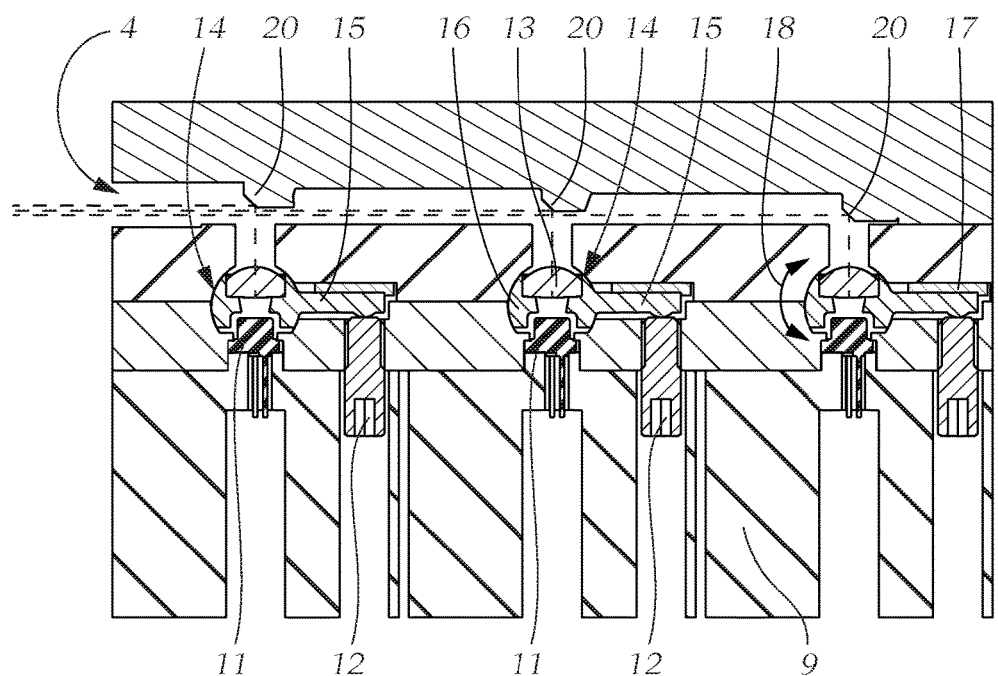
Figure 4:
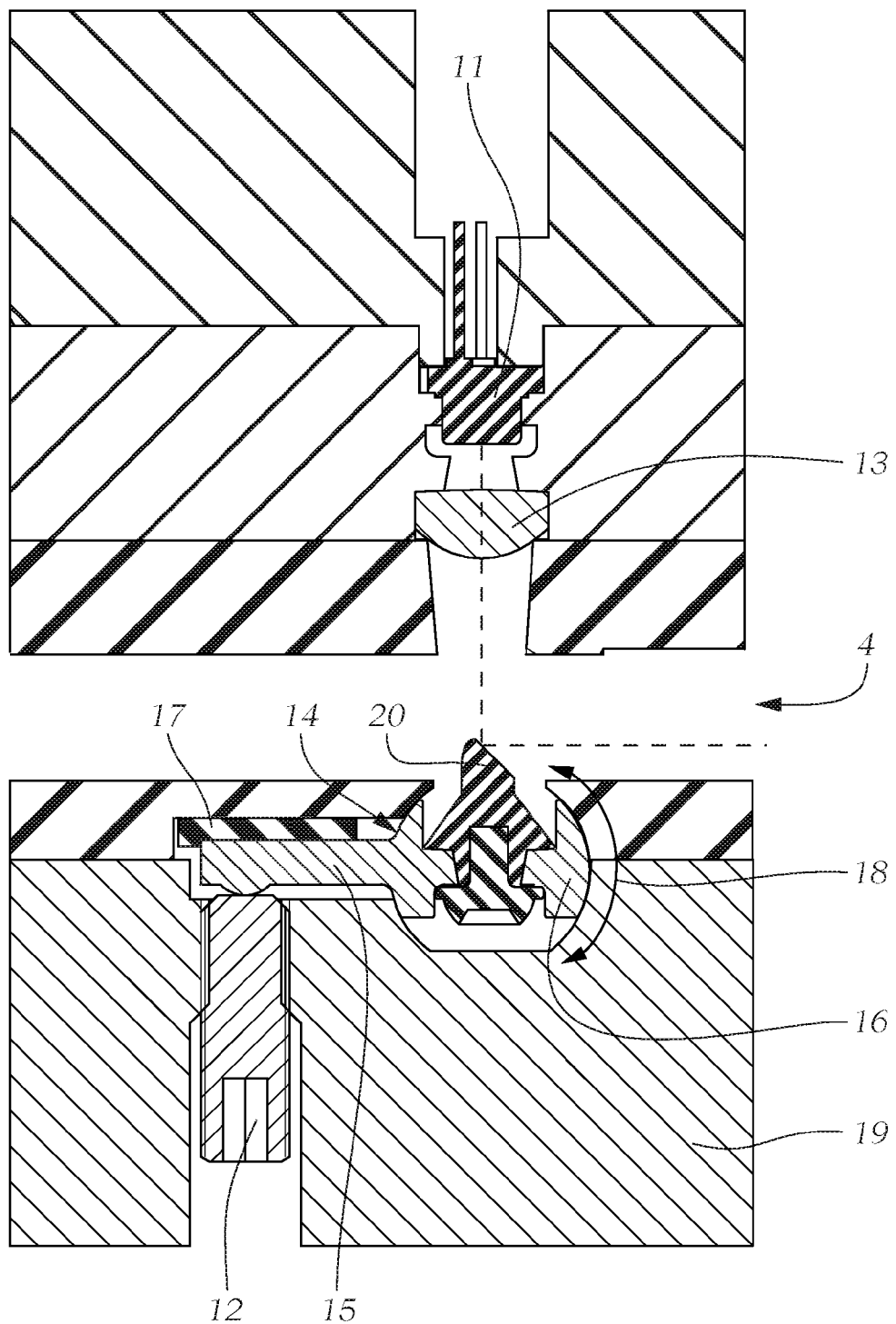
Figure 5:
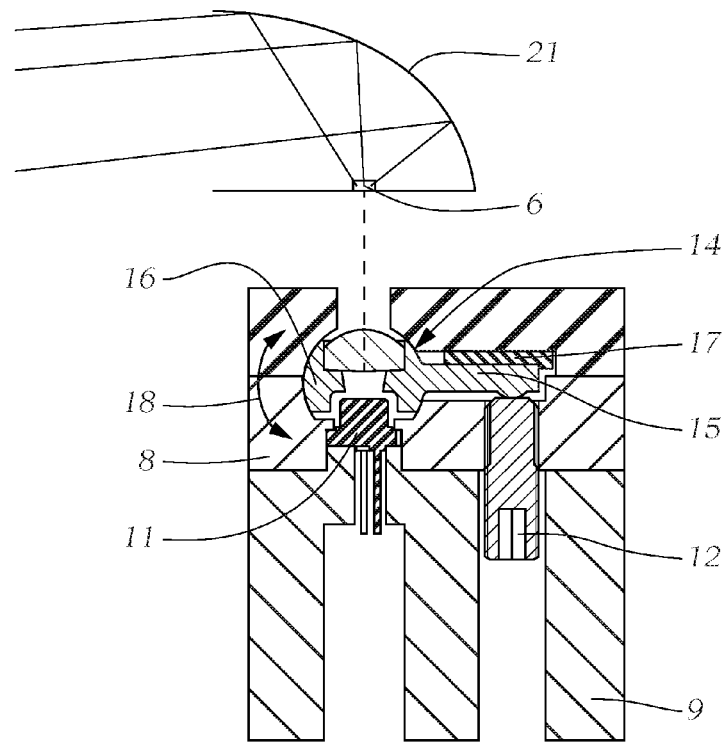
Figure 6:
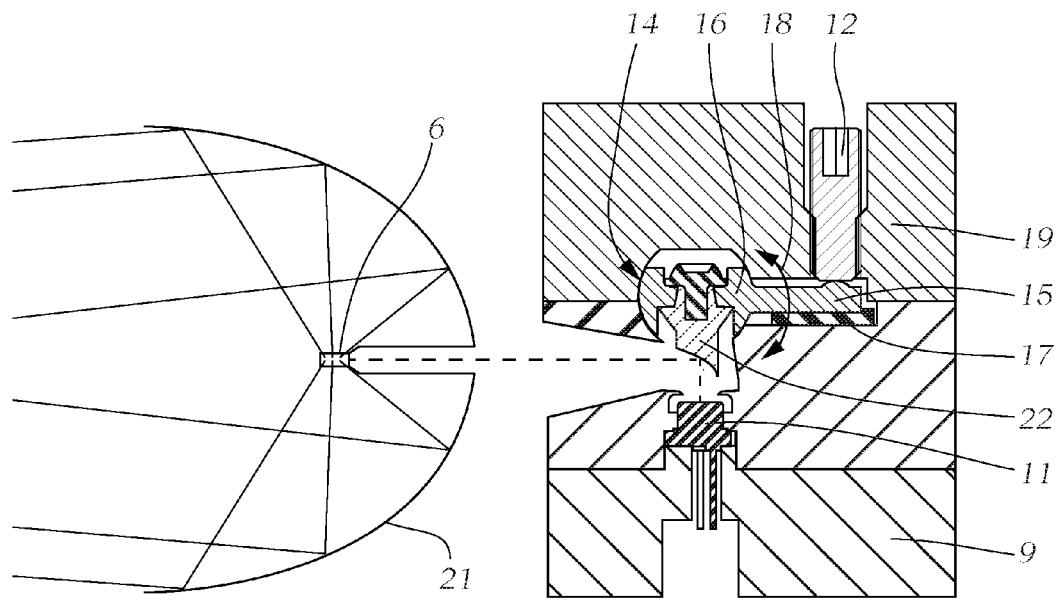
Figure 7:
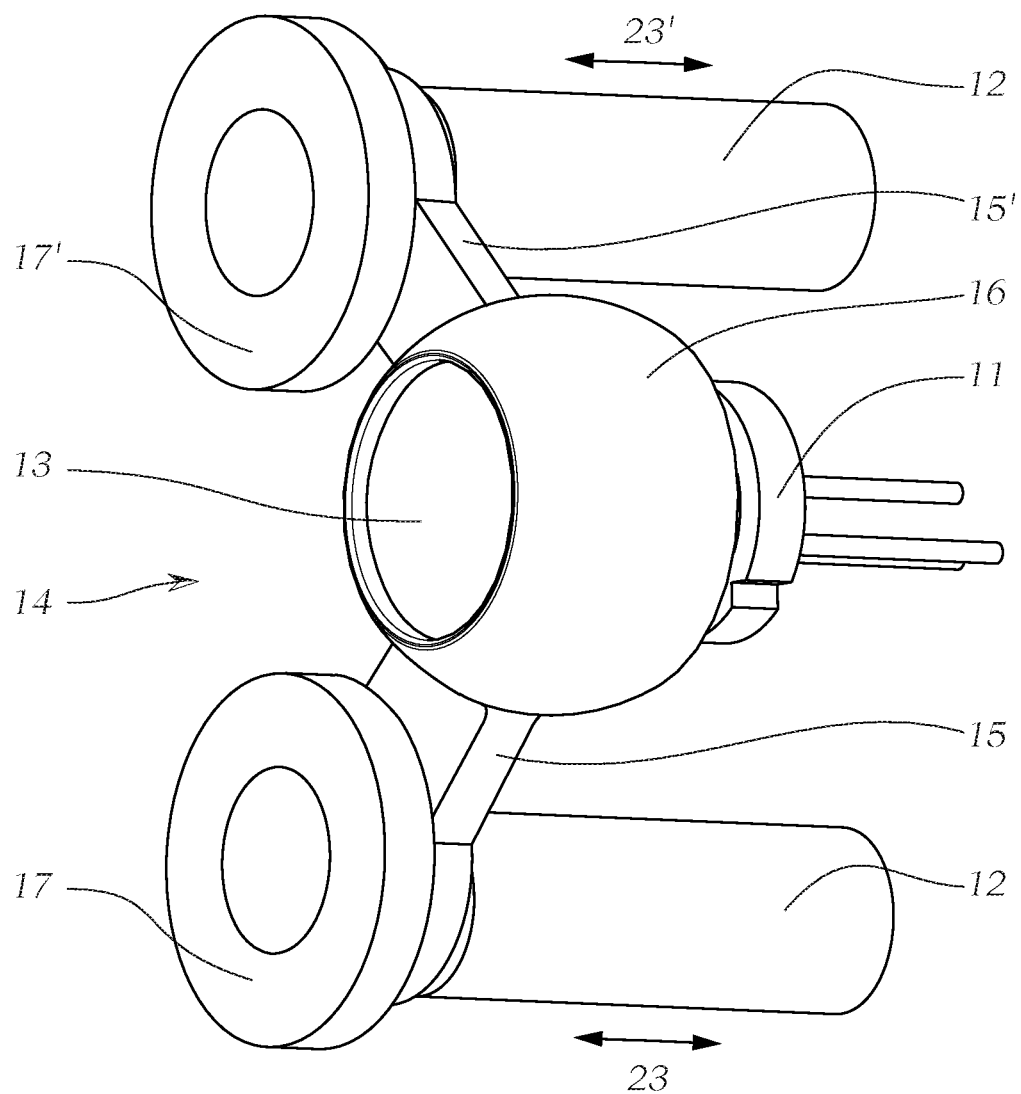

The invention is explained in detail below using a sample embodiment that is schematically illustrated in the drawing. The figures are as follows:

FIG. 1 A perspective overall view of essential parts of a vehicle headlight with multiple inventive laser units;

FIG. 2 A top view of the inventive laser module in FIG. 1 with three laser units;

FIG. 3 A sectional illustration of the inventive laser module in FIG. 2 along the line A-A;

FIG. 4 A sectional illustration of a preferred embodiment of the inventive laser module;

FIG. 5 A sectional illustration of another preferred embodiment of the inventive laser module;

FIG. 6 A sectional illustration of another preferred embodiment of the inventive laser module;

FIG. 7 A perspective illustration of a retaining element according to this invention;

FIGS. 8a and 8b Other sectional illustrations of a preferred embodiment of this invention; and FIG. 9 A detail of an alternative embodiment this invention.

FIG. 1 shows a laser module 1 of a vehicle headlight, which has been omitted for clarity. In this preferred case, laser module 1 has three laser units 2, whose mounting units 3 are combined and form a common beam path 4. In the inventive laser module 1, every laser unit 2 emits laser light, which exits from the beam path 4. The laser light can be directed by a mirror 5, possibly mounted so that it oscillates, onto a phosphor converter or a means of light conversion 6, exciting it to emit visible light. This visible light can be projected by means of a lens 7 onto a road (not shown). What is projected is a light pattern drawn by the laser on the means of light conversion. In addition to such a dynamic system, static systems are also usual, which will be discussed below in connection with other figures.

Each of the laser units 2 has, in addition to the mounting units 3, a support plate 8 and a heat sink 9 fixed onto it that can dissipate the heat coming from the laser diodes 11 to the environment. The heat sink 9 is fixed with screws 10, which are held in corresponding recesses on the heat sink 9.

The heat sinks 9 and the screws 10 can once again be seen in the top view shown in FIG. 2. This illustration shows the laser diodes 11, which in this example are mounted so that they can pivot about two spatial axes at right angles to one another using adjustment screws 12.

In the sectional illustration shown in FIG. 3, it can now be seen that every laser diode 11 is associated with a collimator, in this case in the form of a collimator lens 13, as part of adjustable optics. The collimator lens 13 is mounted in a retaining element 14, which can be pivoted in the direction of the double arrow 18 against the spring action of the elastic spring element 17 by means of the lever 15, which is made in a single piece with a receptacle part 16, by tightening and loosening the adjustment screw 12. Typically, pivoting of ±3° is possible, the person skilled in the art being able to adapt the degree of pivoting as needed by means of simple manual measures. This sectional illustration does not show, however the person skilled in the art can see, when viewing it together with the preceding figures, another lever 15' (FIG. 7) that is arranged on retaining element 14 at a right angle to lever 15 and that pivots the retaining element 14 in the same way as the lever 15. The retaining element(s) 14 are pivotably mounted between a mounting element 3 and a support plate 8, the adjustment screws 12 being held in the support plate 8 so that they can rotate, and can be non-rotatably fixed in a way that is not shown. After the collimator 13, which is adjustable in the inventive laser unit, the light can be deflected using a stationary deflection mirror 20 so that after that it exits from the beam path 4. This example uses three laser beams, which must be oriented as close together as possible to and exactly parallel to one another according to the so-called "knife edge combining" process, to project a homogeneous light pattern on the means of light conversion. This clearly requires high-precision adjustment of the optical system.

It is also possible for the deflection mirror 20 instead of the collimator 13 to be mounted so that it can pivot about two spatial axes, according to the preferred variant of this invention shown in FIG. 4, in which equivalent parts have the same reference numbers. The deflection mirror 20 can also be made in a single piece with the receptacle part 16 or cast into it.

In the inventive preferred variant shown in FIG. 5, neither the beam path nor a deflection mirror are provided, and the light of the laser diode 11 is directed directly onto the phosphor converter 6, which converts part of the laser light, and thus makes a white light source available for the following optical system. The optical system can be a reflector but also a lens or a combination of these elements, as shown in FIG. 5. Here again, equivalent parts have the same reference numbers.

FIG. 6 shows an inventive and preferred variant, in which the adjustable optics are formed by a parabolic mirror 22, which is mounted so that it can pivot in the described way. Thus, here the divergent laser light is collimated through a parabolic mirror 22, which can cooperate with a collimator lens or another optical element or system to focus the laser light after collimation. For example, it would be conceivable to combine a hyperbolic mirror with a correspondingly designed lens to reduce the space requirement.

FIG. 7 shows the retaining element 14 with the collimator 13, the laser diode 11, and the two levers 15 and 15', and two deformable spring elements 17 and 17'. It can be seen that the two levers 15 and 15' are at right angles to one another and act on the receptacle part 16, and in this case are made in a single piece with it. The adjustment screws 12 are able to press the levers in the direction of the double arrows 23 and 23' against the resistance of the deformable spring elements 17 and 17', causing reversible pivoting of the retaining element 14, and thus of the collimator 13.

FIGS. 8a and 8b once again clearly show the pivoting of the receptacle part 16. Screwing in the adjustment screw in the direction of the arrow 23' (FIG. 8a) moves the lever 15, compressing the spring element 17 and causing the receptacle part 16, and thus the collimator 13, to pivot in the direction of arrow 18'. On the other hand, if the adjustment screw 12 is unscrewed in the direction of the arrow 23", the spring action of the spring element 17 causes the receptacle part 16 or of the collimator 13 to pivot in the opposite direction, i.e., in the direction of the arrow 18". The detail view in FIG. 8b clearly shows that the lever 15 has a spherically shaped part 24, to ensure optimal transfer of force from the adjustment screw 12 to the lever 15. It is clear that a spherically shaped part 24' can also be provided on the adjustment screw 12, as is shown in FIG. 9, to achieve the same effect of good transfer of force from the adjustment screw 12 to the lever 15.

The invention claimed is:

1. A laser unit for a vehicle headlight, the laser unit comprising:
   a laser diode; and
   adjustable optics associated with the laser diode, wherein the adjustable optics comprise optical elements comprising at least one collimator, and wherein at least one of the optical elements selected from a collimator (13, 22) and a deflection mirror (20) is mounted in a retaining element (14) so that it can pivot about at least one spatial axis,
   wherein the retaining element (14) has a receptacle part (16) for the collimator (13, 22) or deflection mirror (20) and at least one lever (15, 15'), the at least one lever being configured to act on the receptacle part (16) to pivot the retaining element (14) about a respective spatial axis,
   wherein an elastically deformable spring element (17) is arranged between the at least one lever (15, 15') and a mounting element (3) for the retaining element (14), and the at least one lever (15, 15') is configured to be pressed against the mounting element (3) by an adjustment screw (12).

2. The laser unit of claim 1, wherein the collimator is in the form of an optical collimator lens (13) mounted in the retaining element (14).

3. The laser unit of claim 1, wherein the collimator is in the form of a parabolic mirror (22) mounted in the retaining element (14).

4. The laser unit of claim 1, wherein the deflection mirror (20) is fixed to the retaining element (14).

5. The laser unit of claim 2, wherein the collimator (13, 22) is configured to direct light onto the deflection mirror (20).

6. The laser unit of claim 1, wherein the retaining element (14) is mounted so that it can pivot about two spatial axes.

7. The laser unit of claim 1, wherein the retaining element (14) is mounted so that can pivot about two spatial axes that are at right angles to one another.

8. The laser unit of claim 1, wherein the retaining element (14) has two levers (15, 15') acting on the receptacle part to pivot the retaining element (14) about two spatial axes at right angles to one another.

9. The laser unit of claim 1, wherein the receptacle part (16) and the at least one lever (15, 15') are formed in a single piece.

10. The laser unit of claim 1, wherein the at least one lever (15, 15') and the adjustment screw interact through a spherically shaped part (24, 24').

11. The laser unit of claim 1, wherein the adjustment screw (12) is held in such a way that it can rotate in a support plate (19) fixed on the mounting element (3).

12. The laser unit of claim 1, wherein the adjustment screw (12) is configured to be non-rotatably fixed.

13. The laser unit of claim 1, wherein the adjustment screw (12, 12') is configured to be non-rotatably fixed by a jam nut.

14. The laser unit of claim 1, wherein the retaining element (14) is configured to be fixed by cementing.

15. The laser unit of claim 11, wherein the support plate (19) has a heat sink (9) fastened to it and having recesses for the adjustment screw(s) (12).

16. A laser module (1) comprising multiple laser units (2) according to claim 1.

17. The laser module (1) of claim 16 which comprises three laser units (2) wherein the mounting units of the laser units are combined into a common beam path in which deflection mirrors are fixed.

* * * * *